United States Patent [19]

Reitmeier et al.

[11] Patent Number: 4,506,175
[45] Date of Patent: Mar. 19, 1985

[54] DIGITAL PHASE COMPARATOR CIRCUIT PRODUCING SIGN AND MAGNITUDE OUTPUTS

[75] Inventors: Glenn A. Reitmeier, Trenton, N.J.; Felix Aschwanden, Thalwil, Switzerland

[73] Assignee: RCA Corporation, New York, N.Y.

[21] Appl. No.: 408,143

[22] Filed: Aug. 18, 1982

[51] Int. Cl.³ ............. H03K 19/094; H03K 19/21
[52] U.S. Cl. .................... 307/525; 307/479; 307/514; 307/528; 328/109; 328/133
[58] Field of Search .......... 307/479, 510, 511, 514, 307/516, 525, 527, 528; 328/109, 110, 133, 201; 377/27, 43

[56] References Cited

U.S. PATENT DOCUMENTS

| | | | |
|---|---|---|---|
| 4,237,423 | 12/1980 | Rhodes | 307/516 X |
| 4,308,500 | 12/1981 | Avis | 307/514 X |
| 4,375,693 | 3/1983 | Kuhn | 307/527 X |
| 4,445,224 | 4/1984 | Ihira et al. | 307/516 X |
| 4,446,389 | 5/1984 | Williams et al. | 307/516 X |

Primary Examiner—Stanley D. Miller
Assistant Examiner—David R. Hudspeth
Attorney, Agent, or Firm—E. M. Whitacre; W. H. Meise; H. I. Steckler

[57] ABSTRACT

A phase detector for digital signals, such as television sync signals, provides a signed short path output of the phase difference between the signals. It features a means for determining which of the signals is leading and lagging, which means also provides the sign signal. A window signal is generated and clock pulses are counted during the duration of this signal. A register can provide an exact phase difference measurement or a coarse/fine output signal can be provided.

4 Claims, 3 Drawing Figures

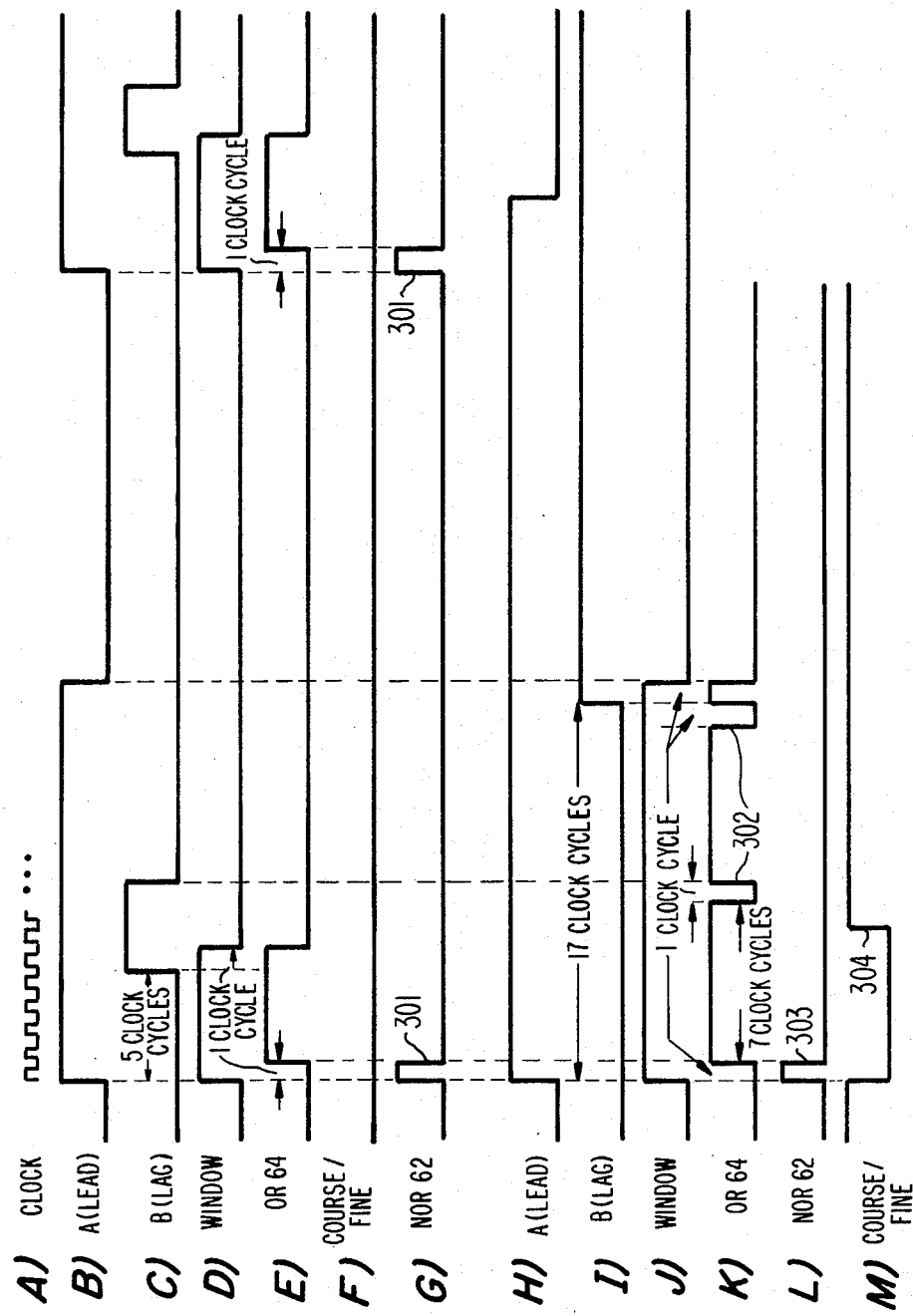

DIGITAL PHASE COMPARATOR CIRCUIT PRODUCING SIGN AND MAGNITUDE OUTPUTS

BACKGROUND OF THE INVENTION

The present invention relates to digital phase comparators, and more particularly, to such comparators intended for use in an integrated circuit broadcast television sync (synchronization) system.

When phase locking one signal to another signal, the initial phase difference between them can be expressed either in the "long path" signless form, e.g. 350 degrees, or the minimum "short path" signed form, e.g. −10 degrees. In general, the unsigned form results in a large variable lock-up time, while the minimum direction or difference signed form will result in shorter lock-up time for the two signals. However, typical prior art phase comparator circuits provide the unsigned form as an output signal. Further, such prior art circuits may not provide information about the exact magnitude of the phase difference and may require that both input signals have a precise duty cycle, or alternatively, that both input signals have identical duty cycles.

It is therefore desirable to provide a phase comparator that provides an output signal having both magnitude and direction information as to the minimum difference of the phase difference of two input signals and which does not require precise duty cycle of both input signals.

SUMMARY OF THE INVENTION

Method and apparatus for comparing the phase of first and second digital signals, comprising determining which of the digital signals is the leading digital signal and which of the digital signals is the lagging digital signal; generating a window signal having a starting time in accordance with said leading signal and an ending time in accordance with said lagging signal; and counting clock pulses in accordance with the duration of said window signal.

DESCRIPTION OF THE DRAWINGS

FIG. 3 is a timing diagram explaining the operation of FIG. 2.

DETAILED DESCRIPTION

Figure 1:
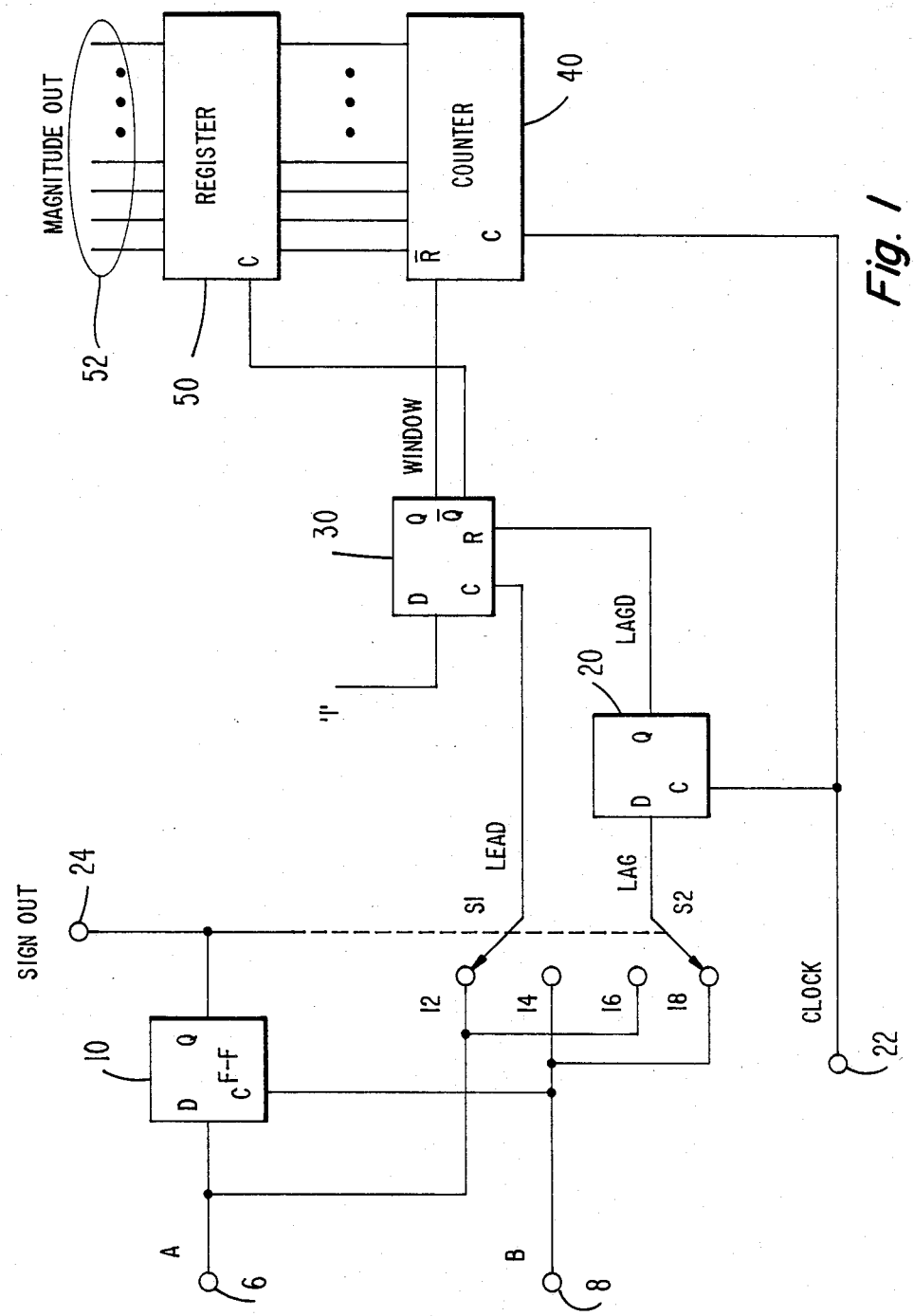
FIG. 1 is a block diagram of a circuit in accordance with a first embodiment of the invention.

FIG. 1 shows a circuit in accordance with a first embodiment of the invention, which receives input signals A and B whose phase is to be compared at terminals 6 and 8 respectively. In accordance with a principle of the invention, it makes no difference whether signal A is leading signal B or vice versa, and thus either signal can be applied to either terminal 6 and 8 with the remaining signal applied to the remaining terminal, as will be explained below.

Signal A is clocked into edge-triggered type-D flip-flop 10 by the leading edge of signal B, and thus the Q output of flip-flop 10 contains the direction of the phase difference between the two signals. For example, if the Q output of flip-flop 10 is a ONE, then signal A leads signal B, but if the Q output is ZERO, signal B leads signal A. In order for the circuit outputs of FIG. 1 (described below) to always indicate the minimum direction ("short path") of phase difference, signal A must have a 50% duty cycle since if signal B starts after the 50% point between leading edges of signal A, it is the phase difference to the next succeeding leading edge that is desired to be measured. This 50% duty cycle is not required if a non-minimum phase difference is acceptable, and thus not essential to operation of the circuit.

The Q output of flip-flop 10 is provided at output terminal 24 to indicate the sign of the phase difference and also controls the positions of switches S1 and S2, in order to direct the signals A and B to the appropriate LEAD and LAG outputs of switches S1 and S2, respectively. Thus if the Q output of flip-flop 10 is a ONE, then switches S1 and S2 are in the positions shown in FIG. 1 and switch S1 is connected to contact 12, while switch S2 is connected to contact 18. Likewise if the Q output is ZERO, then switches S1 and S2 are in positions opposite to that shown in FIG. 1. In particular switch S1 is connected to contact 14 and switch S2 is connected to contact 16. In this way, signals A and B are arranged into leading and lagging signals, whose phase difference can now be measured. The LEAD signal clocks a hardwired ONE into edge-triggered type-D flip-flop 30, while the LAG signal is delayed one cycle of a clock signal present at input terminal 22 by type D flip-flop 20, whose LAGD output resets flip-flop 30. The clock signal has a frequency higher than signals A or B in accordance with the desired resolution of the phase measurement. Thus the Q output of flip-flop 30 is a WINDOW signal whose width is indicative of the time difference in the leading edges of the two input signals. If the two input signals are coincident, the WINDOW signal will be one clock cycle wide, while if the input signals are N clock cycles apart, the WINDOW signal will be N+1 clock cycles wide. This WINDOW signal is then applied to the $\overline{\text{RESET}}$ input of counter 40, while the clock signal is applied to the clock input of said counter. This results in the counter containing the value ZERO unless the WINDOW signal is a ONE, during which time when WINDOW is ONE, the occurrence of a clock pulse will advance counter 40. Note that the WINDOW signal must be N+1 clock cycles wide in order to advance counter 40 by N counts, since clock edges coincident with either leading or trailing edges of the window signal will not advance counter 40. Only those clock edges within the WINDOW signal advance counter 40. The $\overline{\text{Q}}$ output of flip-flop 30, i.e., $\overline{\text{WINDOW}}$, can be used to latch the outputs of counter 40 into register 50, which thus contains the measurement of the magnitude of the phase difference between signals A and B. Parallel outputs 52 provide the magnitude of the phase difference.

Counter 40 may be simple binary ripple counter, although in high speed applications, a synchronous counter may be necessary. This embodiment of the invention requires a counter 40 and register 50 accommodating at least as many states as the maximum phase difference to be measured, thus requiring a minimum number of states equal to the number of clock cycles in 50% of the period of the input signal A, assuming that signal A has a 50% duty cycle. This is required so that the counter does not overflow and erroneously indicate an in-phase condition. Only 50% is required due to the sign bit present at output terminal 24. This compares with 100% for the prior art. If signal A does not have a 50% duty cycle, a larger counter 40 is required, since the longer portion of the signal A period must then be measured.

Figure 2:
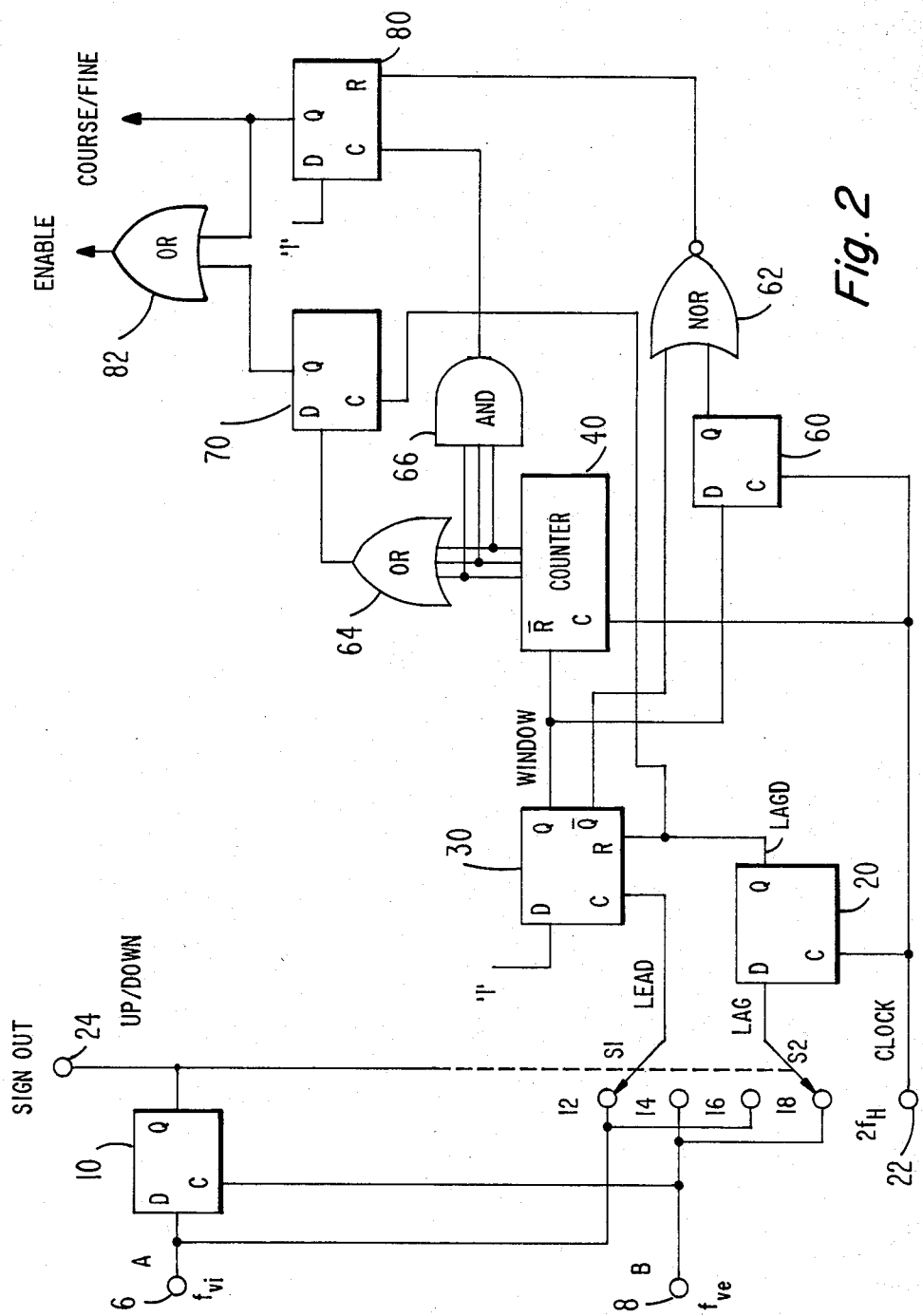
FIG. 2 is a block diagram of a second embodiment of the invention.

FIG. 2 shows a second embodiment of the circuit for use when an exact measurement of the phase difference is not required. This allows shortening the length of counter 40 and a reduction in the number of flip-flops required to indicate the phase difference. An application for such an embodiment is to measure the phase difference between internally generated vertical sync $f_{vi}$ and externally generated vertical sync $f_{ve}$, which comprises input signals A and B respectively. The clock signal comprises a twice horizontal frequency signal $2f_H$. The sign bit at output terminal 24 comprises an UP/DOWN control bit for a phase controller (not shown). In this embodiment, counter 40 is shown as a 3-bit counter, and two flip-flops are used to indicate the presence of phase differences between 1 and 7 clock cycles (a "fine" error) and 7 or more clock cycles (a "coarse" error). In this way, the circuit can be used to measure small phase differences using a clock that is high in frequency relative to the input signals, without the need for a large counter and register.

The left portion circuit of FIG. 2 functions in the same manner as that of FIG. 1. The remaining portion will be described in conjunction with FIG. 3, wherein FIG. 3A is the clock signal and FIGS. 3B to 3G are for a fine error, while FIGS. 3H to 3M are for a coarse error, both cases assuming signal A leads signal B.

If a fine error occurs, which is assumed for illustrative purposes to be five clock cycles shown between FIGS. 3B (input signal A) and 3C (input signal B), counter 40 counts the clock pulses of FIG. 3A for the duration of the WINDOW signal of FIG. 3D. As soon as the first stage of counter 40 has a ONE state, OR gate 64, which is coupled to the outputs all of the stages of counter 40, provides a ONE signal shown in FIG. 3E to the D input of type-D flip-flop 70. This ONE signal is provided at the Q output of flip-flop 70 upon the occurence of the LAGD signal (which is the same as FIG. 3C, but delayed by one clock cycle) from flip-flop 20, i.e., at the end of a phase measurement period. Therefore at said time, a ONE appears at the output of OR gate 82, which ONE comprises an ENABLE signal for a counter (not shown) to indicate that a phase error between signals A and B has occurred.

Type-D flip-flop 60 provides a one clock cycle delayed WINDOW signal at its Q output, which delayed signal is provided to an input of NOR gate 62. The other input of gate 62 is the $\overline{\text{WINDOW}}$ signal from the $\overline{Q}$ output of flip-flop 30. Thus the output of gate 62 is a one clock cycle wise ONE pulses 301 shown in FIG. 3G. These pulses 301 reset flip-flop 80 at the beginning of each phase measurement period. AND gate 66 is coupled to the outputs of all stages of counter 40; however since only a fine error has occurred, counter 40 is not full, and therefore a ZERO signal is provided by gate 66 to the clock input of flip-flop 80. Thus flip-flop 80 is not clocked and therefore its Q output, which is a COARSE/FINE signals, remains ZERO (as shown in FIG. 3F), thereby indicating a fine or no error. This ZERO signal is also applied to OR gate 82, but since a ONE signal is applied from flip-flop 70, the output of gate 82 remains a ONE.

If a coarse error occurs, such as 17 clock pulses illustrated between the signals A and B in FIGS. 3H and 3I respectively, then counter 40 counts clock pulses for the duration of WINDOW signal shown in FIG. 3J. As before, OR gate 64 provides a ONE output as soon as the first stage of counter 64 has a ONE output. However, as shown in FIG. 3K, negative going pulses 302 are present in the output signal of gate 64 at the eight and sixteenth clock pulses since the stages of 3-bit counter 40 periodically reach an all-ZERO state. Thus when signal 302 is clocked into flip-flop 70, the resulting output of flip-flop 70 will not always be ONE.

As before, flip-flop 80 is reset at the beginning of each phase measurement period by NOR gate 62 supplying pulses 303 shown in FIG. 3L. However when a coarse (greater than or equal to 7 clock cycles) error is present, AND gate 66 provides a ONE signal when counter 40 reaches its maximum count. This clocks a hardwired ONE into flip-flop 80. This ONE shown as pulse 304 in FIG. 3M, appears at the Q output of flip-flop 80 to indicate that a coarse error is present and is also applied to OR gate 82 so that its output is now ensured to be ONE, i.e., it fills in the ZEROES caused by pulses 302.

It should be understood that FIG. 2 could be modified to provide multiple outputs each indicative of a particular magnitude of phase difference and obtained by decoding the outputs of counter 40 and controlling a flip-flop in the same manner as flip-flop 80. In this manner, more than two quantized measurements of phase differences may be produced.

What is claimed is:

1. Apparatus for comparing the phase of the transitions of first and second signals, said apparatus comprising:

a first flip-flop including first and second input terminals each of which is coupled for receiving one of said first and second signals, and also including an output terminal at which a phase direction signal is generated which is indicative of which of said first and second signals is a leading signal in which said transition is leading in phase, and which of said first and second signals is a lagging signal in which said transition is lagging in phase;

switch means having two input terminals coupled for receiving said first and second signals, first and second output terminals, and a control input terminl coupled to said output terminal of said first flip-flop for controlling said switch means in response to said phase direction signal, for coupling said first and second signals respectively to opposite ones of said first and second output terminals for providing said leading signal and said lagging signal, respectively, under control of said phase direction signal;

window signal generating means coupled to said first and second output terminals of said switch means for receiving said leading and lagging signals for initiating a window signal in response to the transition of said leading signal and terminating said window signal in response to said transition of said lagging signal;

clock pulse generating means for generating clock pulses; and counting means coupled to said window signal generating means and to said clock pulse generating means for counting said clock pulses during said window signal for generating a signal indicative of the magnitude of the phase difference between said transitions of said first and second signals.

2. Apparatus according to claim 1, wherein said window signal generating means comprises second and third flip-flops, said second flip-flop including an output terminal and a first input terminal coupled to said first output terminal of said switch means for receiving said leading signal therefrom, said window signal being initiated as an output signal from said output terminal of said second flip-flop during said transition of said leading signal, said second flip-flop also including a reset input terminal for receiving a window terminating signal, said third flip-flop including an input terminal coupled to said second output terminal of said switch means for receiving said lagging signal therefrom for coupling said lagging signal to an output terminal of said third flip-flop to form said window terminating signal.

3. Apparatus as claimed in claim 2, further comprising a register coupled to said counting means for receiving said signal indicative of the magnitude of the phase difference between said transitions of said first and second signals and coupled to said second flip-flop for latching said signal indicative of the magnitude of the phase difference between said transitions of said first and second signals upon the termination of said window signal.

4. Apparatus as claimed in claim 2, further comprising:

a first OR gate coupled to said counting means for generating an error exists signal indicative of the existence of a phase error;

an AND gate coupled to said counting means for generating a full count signal indicative that a full count has been reached;

a fourth flipflop having inputs coupled to said OR gate for receiving said error exists signal and also coupled to said third flipflop for receiving said window signal terminating signal therefrom for latching said error exists signal to generate a latched error exists signal;

reset signal generating means coupled to said window signal generating means for generating a reset pulse immediately following initiation of said window signal;

a fifth flipflop having inputs coupled to said AND gate for receiving said full count signal therefrom and coupled to said reset signal generating means for receiving said reset pulse therefrom for being reset immediately following initiation of said window pulse and having an output terminal for supplying a coarse/fine signal; and a second OR gate having input terminals coupled to said fourth flipflop and to said fifth flipflop for receiving said latched error exists signal and said coarse/fine signal, respectively, therefrom for generating an enable signal indicative of existence of a phase error.

* * * * *